(12) United States Patent
Shen et al.

(10) Patent No.: US 9,273,390 B2
(45) Date of Patent: Mar. 1, 2016

(54) APPARATUS AND METHOD FOR COATING ORGANIC FILM

(71) Applicant: BOE TECHNOLOGY GROUP CO., LTD., Beijing (CN)

(72) Inventors: Wulin Shen, Beijing (CN); Chunsheng Jiang, Beijing (CN); Qing Dai, Beijing (CN); Haijing Chen, Beijing (CN); Guangcai Yuan, Beijing (CN); Jingang Fang, Beijing (CN)

(73) Assignee: BOE TECHNOLOGY GROUP CO., Ltd., Beijing (CN)

( * ) Notice: Subject to any disclaimer, the term of this patent is extended or adjusted under 35 U.S.C. 154(b) by 0 days.

(21) Appl. No.: 14/708,786

(22) Filed: May 11, 2015

(65) Prior Publication Data
US 2015/0240345 A1 Aug. 27, 2015

Related U.S. Application Data

(62) Division of application No. 14/241,723, filed as application No. PCT/CN2013/089606 on Dec. 16, 2013, now abandoned.

(30) Foreign Application Priority Data

Jun. 9, 2013 (CN) .......................... 2013 1 0231659

(51) Int. Cl.
*C23C 16/00* (2006.01)
*C23C 16/50* (2006.01)
(Continued)

(52) U.S. Cl.
CPC ................. *C23C 14/30* (2013.01); *B05B 5/001* (2013.01); *B05B 5/03* (2013.01); *B05B 5/0533* (2013.01);
(Continued)

(58) Field of Classification Search
CPC .......... B05B 5/001; B05B 5/03; B05D 1/007; B05D 1/60; H01L 51/56

USPC ................... 257/40, 773, E21.007, E21.024, 257/E21.211, E21.242, E21.299; 118/723 EB, 723 R, 723 DC
See application file for complete search history.

(56) References Cited

U.S. PATENT DOCUMENTS

2010/0170439 A1* 7/2010 Negishi ................. C23C 14/042
118/720
2010/0170444 A1* 7/2010 Negishi ................... C23C 14/12
118/726

(Continued)

FOREIGN PATENT DOCUMENTS

CN 1369921 A 9/2002
CN 1605652 A 4/2005
(Continued)

OTHER PUBLICATIONS

First Office Action issued by the Chinese Patent Office for Chinese Patent Application No. 201310231659.3 dated May 26, 2014, 7pgs.
(Continued)

*Primary Examiner* — Mohsen Ahmadi

(57) ABSTRACT

An apparatus and method for coating an organic film are disclosed. The apparatus comprises an evaporation device, an electron emission device and a spray device; wherein the evaporation device comprises an evaporation container, the evaporation container is a linear evaporation container, in which a uniform organic gas is generated; the electron emission device is horizontally arranged over the evaporation container such that the organic gas evaporated in the evaporation container is uniformly charged and becomes charged organic gas; the spray device is provided with an electric field, under which the charged organic gas is moved toward a substrate so as to deposit the organic film on the substrate.

10 Claims, 3 Drawing Sheets

(51) Int. Cl.
  *C23C 14/30* (2006.01)
  *C23C 14/12* (2006.01)
  *C23C 14/24* (2006.01)
  *B05B 5/00* (2006.01)
  *B05B 5/03* (2006.01)
  *B05B 5/053* (2006.01)
  *B05D 1/00* (2006.01)
  *H01L 51/00* (2006.01)
  *H01L 51/56* (2006.01)
  *C23C 14/04* (2006.01)

(52) U.S. Cl.
  CPC  *B05D 1/007* (2013.01); *B05D 1/60* (2013.01); *C23C 14/042* (2013.01); *C23C 14/12* (2013.01); *C23C 14/24* (2013.01); *H01L 51/0013* (2013.01); *H01L 51/56* (2013.01)

(56) References Cited

U.S. PATENT DOCUMENTS

| | | | |
|---|---|---|---|
| 2010/0247747 A1* | 9/2010 | Yamazaki | C23C 14/12 427/66 |
| 2011/0021007 A1 | 1/2011 | de Rochemont et al. | |
| 2014/0183460 A1 | 7/2014 | Kim et al. | |

FOREIGN PATENT DOCUMENTS

| | | |
|---|---|---|
| CN | 103305794 A | 9/2013 |
| CN | 203270020 A | 11/2013 |
| JP | 2008202100 A | 9/2008 |
| JP | 20133041686 A | 2/2013 |

OTHER PUBLICATIONS

English translation of First Office Action issued by the Chinese Patent Office for Chinese Patent Application No. 201310231659.3 dated May 26, 2014, 7pgs.

International Search Report for International Application No. PCT/CN2013/089606, 12pgs.

Second Office Action issued by the Chinese Patent Office for Chinese Patent Application No. 201310231659.3 dated Dec. 16, 2014, 4pgs.

English translation of Second Office Action issued by the Chinese Patent Office for Chinese Patent Application No. 201310231659.3 dated Dec. 16, 2014, 5pgs.

Rejection Decision issued by the Chinese Patent Office for Chinese Patent Application No. 201310231659.3 dated Apr. 28, 2015, 4pgs.

English translation of Rejection Decision issued by the Chinese Patent Office for Chinese Patent Application No. 201310231659.3 dated Apr. 28, 2015, 6pgs.

PCT International Preliminary Report on Patentability, issued by The International Bureau of WIPO, for International Application No. PCT/CN2013/089606, dated Dec. 15, 2015; 9 pages.

* cited by examiner

```
┌─────────────────────────────────────────────┐
│ uniformly heating the organic material to    │── S11
│ generate the organic gas                     │
└─────────────────────────────────────────────┘
                      │
                      ▼
┌─────────────────────────────────────────────┐
│ linearly evaporating the organic gas and     │── S12
│ emitting the uniform organic gas             │
└─────────────────────────────────────────────┘
```

Fig.6

```
┌─────────────────────────────────────────────────────┐
│ generating the electric field by a potential         │
│ difference between an electrode plate arranged in    │── S31
│ top of the spray chamber and the base of the spray   │
│ chamber, when a bias voltage being applied by the    │
│ external power supply                                │
└─────────────────────────────────────────────────────┘
                           │
                           ▼
┌─────────────────────────────────────────────────────┐
│ after the charged organic gas reaches the spray      │
│ chamber, downwardly accelerating and moving the      │── S32
│ charged organic gas under an effect of a downward    │
│ electric field force                                 │
└─────────────────────────────────────────────────────┘
                           │
                           ▼
┌─────────────────────────────────────────────────────┐
│ after the charged organic gas reaches the spray head │
│ at bottom of the spray chamber, spraying the charged │── S33
│ organic gas out of the spray head                    │
└─────────────────────────────────────────────────────┘
                           │
                           ▼
┌─────────────────────────────────────────────────────┐
│ depositing the sprayed organic gas which is passed   │
│ through the mask to form the organic film on the     │── S34
│ substrate                                            │
└─────────────────────────────────────────────────────┘
```

Fig.7

APPARATUS AND METHOD FOR COATING ORGANIC FILM

CROSS REFERENCE TO RELATED APPLICATIONS

This divisional application is based on U.S. patent application Ser. No. 14/241,723 filed on Feb. 27, 2014, which claims priority to PCT/CN2013/089606 filed on Dec. 16, 2013, which claims priority to Chinese National Application No. 201310231659.3 filed on Jun. 9, 2013. The entire contents of each and every foregoing application are incorporated herein by reference.

FIELD OF THE ART

Embodiments of the present invention relate to a field of manufacturing an active matrix organic light emitting diode, particularly relates to an apparatus and a method for coating an organic film.

BACKGROUND

OLED (Organic Light Emitting Diode) display, which is provided with an extremely thin organic material coating and a glass substrate, can achieve self-illumination, since the organic material may illuminate when the current pass through it. The OLED display has attracted considerable attention duo to the advantages such as wide viewing angle, significant power saving, simple structure and high quality dynamic picture.

Currently, the OLED display is gradually mass produced. Particularly, the research on the large size AMOLED (Active Matrix Organic Light Emitting Diode) display is becoming a hotspot, and then the EL (electroluminescent) module used in AMOLED display is also becoming a main research object. In the conventional process, organic film used in the luminescent layer of the EL module is formed by evaporation. In conventional evaporation process, the evaporation source is a single point source, from which the organic molecules are gasified or sublimated without directionality. The proportion of the material coated on the substrate to the material evaporated is very low, because many sublimated molecules are attached to the evaporation chamber rather than on the substrate. Moreover, it is difficult to form a uniform film by the single point source, because the distance between the evaporation source and the coating position varies with the change of the coating position on the substrate.

It is required to provide an evaporation apparatus by which a large area organic film can be formed with high accuracy, because the uniformity of the film has a great influence on the brightness and the chromaticity of luminescence. In the conventional technology, an apparatus for coating a large area film comprises: a container 24, an evaporated steam flow adjustor 25 and a top plate 26 (as shown in FIG. 1). In addition, the apparatus further comprises a heating device (not shown in FIG. 1). The evaporated steam flow adjustor 25 has a porous layered structure and is disposed between the container 24 and the top plate 26. The evaporated steam flow adjustor 25 is used to control the flow and the direction of the evaporated steam and enlarging the steam distribution area, so as to spray the steam uniformly onto the substrate for providing a planar film formed of sprayed spots. The overlapped deposition area of spray nozzles 261 can be adjusted by changing the distribution and diameter of the spray nozzles 261. However, because the accuracy of deposition cannot be improved by above apparatus and process, the serious waste of organic material has not been avoided and the deposition rate has not been improved yet.

Therefore, selecting for appropriate organic materials and designing a more efficient deposition apparatus, which are beneficial to improve the utilization and the accuracy of the organic materials deposition, become the focus of researcher and manufactory. However, during the conventional process for coating an organic material, the deposited pattern is significantly deformed and is not uniform at all due to the dimensional error and the low accuracy of the mask, thus, the pixel crosstalk and short circuit may occur, the deposition accuracy and the defect-free rate may be further decreased.

SUMMARY

Embodiments of the invention provide an apparatus and a method for coating an organic film, by which the organic material can be uniformly deposited onto the substrate, so as to improve the deposition accuracy and deposition rate, realize the uniformity of the film thickness, enhance the utilization of the organic material, and avoid the waste of the organic material.

According to a first aspect of the invention, it is provided an apparatus for coating an organic film comprising an evaporation device, an electron emission device and a spray device;

wherein said evaporation device comprises an evaporation container, said evaporation container is a linear evaporation container, in which a uniform organic gas is generated;

said electron emission device is horizontally arranged over the evaporation container such that the organic gas evaporated in the evaporation container is uniformly charged and becomes charged organic gas;

said spray device is provided with an electric field, under which the charged organic gas is moved toward a substrate so as to deposit the organic film on the substrate.

According to a second aspect of the invention, it is provided a method for coating an organic film, comprising:

heating and evaporating an organic material to generate uniform organic gas;

uniformly charging the uniform organic gas for obtaining charged organic gas; and accelerating and moving the charged organic gas toward the substrate under an effect of an electric field to form the organic film on the substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 6 is a flow chart illustrating step S1 in the method for coating an organic film of the second embodiment of the present invention;

FIG. 7 is a flow chart illustrating step S3 in the method for coating an organic film of the second embodiment of the present invention.

REFERENCE NUMERALS

1—heating source 2—organic material 3—evaporation container 4—barrier 5—electron emission device 6—insulator 7—electrode plate 8—spray chamber 9—gas channel 10—sidewall of the spray chamber 11—spray head 12—mask 13—substrate 14—platform 15—evaporation opening 24—container 25—evaporated steam flow adjustor 26—evaporation top plate 261—spray nozzle 91—evaporation device 92—spray device.

DETAILED DESCRIPTION

In order to make objects, technical details and advantages of the embodiments of the invention apparent, the technical solution of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

First Embodiment

Figure 1:
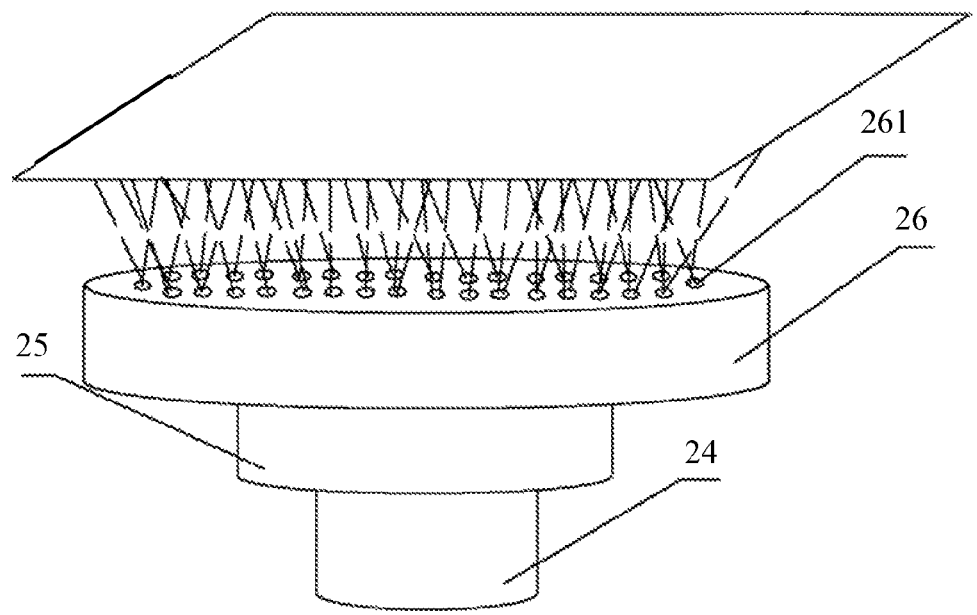
FIG. 1 is a view schematically illustrating an apparatus for evaporating an organic material in conventional technology.
Figure 2:
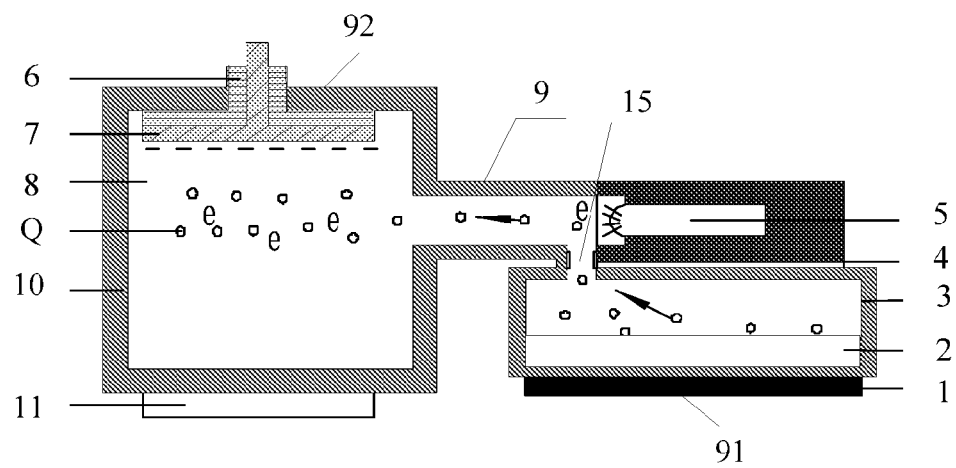
FIG. 2 is a view schematically illustrating an apparatus for evaporating an organic film provided by a first embodiment of the present invention.

The first embodiment of the present invention provides an apparatus for coating an organic film, which comprises an evaporation device 91, an electron emission device 5 and a spray device 92, as shown in FIG. 2.

The evaporation device comprises an evaporation container 3. The evaporation container 3 is a linear evaporation container which generates uniform organic gas. The so-called "linear" evaporation container is the container in which the uniform organic gas can be generated under the heat of a linear heating source. The evaporation container 3, in which an organic material 2 is contained, is typically made of the stainless steel.

The evaporation device further comprises a heating source 1, which may be a linear heating source or a plurality of heating sources parallel to each other. The heating source 1 arranged at the bottom of the evaporation container 3 heats the organic material 2 disposed in the evaporation container 3 to provide the heat for evaporating the organic material 2. For example, the heating source 1 may consists of coils, and an AC voltage from an AC power source at outside of the evaporation container 3 is applied to the coils with a given frequency, which can accurately control the heating temperature, so as to ensure the organic material is heated uniformly.

The evaporation container 3 is the linear evaporation container with a slit-like evaporation opening 15 at the top of the evaporation container 3. In one example, a cooling pipe is arranged around the evaporation container 3 (not shown in FIG. 2). The cooling pipe is filled with circulating refrigerant (such as gas) to maintain the temperature of the evaporation container 3, so that the occurrence of thermal cracking and chemical reaction of the organic material can be suppressed.

The electron emission device 5 is horizontally arranged over the evaporation container 3 and emits the electron "e". The electron emission port of the electron emission device 5 is arranged over the evaporation opening 15, so that the organic gas evaporated from the evaporation opening 15 is uniformly charged and becomes the charged organic gas (represented by "Q" in FIG. 2). By moving a movable barrier 4 (such as push-pull type barrier) arranged at a side of the evaporation opening 15, the evaporation opening 15 can be opened or closed, such that the amount of the organic gas evaporated from the evaporation container 3 is controllable. The barrier 4 can be manipulated to close the evaporation opening while the deposition process is not necessary. Because the organic material still keeps being evaporated under the residual heat of the heating source, the organic material may be wasted. Therefore, it is preferable to provide a barrier that closes the evaporation opening in time in order to improve the utilization of the material and save the cost.

The electron emission device 5 is horizontally arranged over the evaporation container 3. The electron emission device 5 may be a linear electron gun or a plurality of small-sized electron guns arranged with equal interval and emits the electrons uniformly. The electrons attach to the organic gas, thus the organic gas is charged uniformly and sufficiently. The energy of the electrons emitted from the electron gun should not be too high to avoid damage the organic material. The electron gun may be a thermionic emission tungsten cathode electron gun or a cold cathode field emission electron gun. However, the method for charging the organic gas is not limited to the above embodiment, for example, the organic gas can also be charged by positive charge.

Using the electron emission device 5, the charged organic gas Q is obtained by uniformly charging the organic gas evaporated from the evaporation container 3.

In the spray device 92, the charged organic gas Q moves to the substrate 13 under the effect of electric field so as to form an organic film on the substrate 13. For example, the spray device may comprise electrode plate 7, a spray chamber 8 and a spray head 11.

Figure 3:
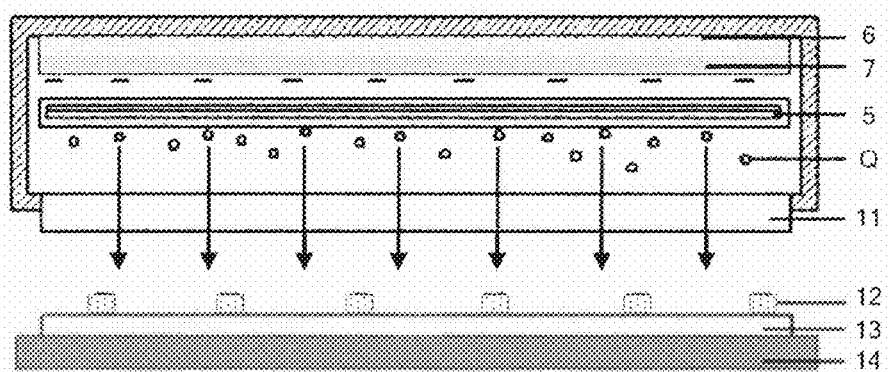
FIG. 3 is a cross-section view schematically illustrating charged organic gas which is deposited from a spray chamber onto a surface of a substrate in the first embodiment of the present invention.

The electrode plate 7 is arranged in the top of the spray chamber 8, and the spray head 11 is located at the bottom of the spray chamber 8. The electrode plate 7 generates the electric field when a bias voltage from an exterior power supply is supplied to the plate 7. Under the effect of the electric field, the charged organic gas is driven to spray out from the spray head 11 of the spray device 92 so as to form an organic film on the substrate 13. For example, in this embodiment, the charged organic gas Q is driven by the vertically downward electric field force and moved from the upper portion to the lower portion of the spray chamber 8, then the charged organic gas is sprayed out through the spray head 11 to the substrate 13 and form the organic film thereon, as shown in FIG. 3.

The magnitude of the bias voltage provided by the exterior power supply may be adjusted depending on the situation of the organic film deposition. In one example, another electrode plate may be arranged opposed to the electrode plate 7. Another electrode plate may be directly grounded, or may be arranged adjacent to the spray head 11, or may be arranged under a conveyer of the platform 14. The exterior power supply may provide a positives or negative bias voltage, which is depended on the polarity of the charged organic gas (namely, the polarity of the charge emitted by the electron emission device 7). If the electron emission device 7 emits a positive charge and the polarity of the charged organic gas is also positive, the electrode plate 7 should be applied a positive bias voltage to generate a vertically downward electric field, under which the organic gas with the positive charge is driven to move downwardly by a downward electric field force. If the electron emission device 7 emits the negative charge and the polarity of the charged organic gas is also negative, the electrode plate 7 should be applied a negative bias voltage to generate a vertically upward electric field, under which the organic gas with the negative charge is driven to move downwardly by a downward electric field force.

In this embodiment, for example, electrode plate 7 may be made of stainless steel, but is not limited to this material. The size of the electrode plate 7 is depended on the space of the upper portion of the spray chamber 8. In order to achieve sufficient velocity of the organic gas, it is necessary to design the spray chamber 8 with a long enough distance in the vertical direction. In order to improve the uniformity of the film to be formed, it is also necessary to design the chamber 8 with a long enough width in the horizontal direction. For example, sidewall 10 of the spray chamber 8 may be made of stainless steel, but is not limited to this material.

This embodiment is not limited to the above embodiment, and may be variously changed. For example, the number or configuration of the evaporation container, the shape, configuration or size of the evaporation opening, or the size of the spray head mentioned in the above embodiment may be changed.

The charged organic gas enters the spray chamber 8, whose position and size is not limited. However, in order to charge the organic gas sufficiently and uniformly, the distance between the spray chamber 8 and the electron gun 5 and the distance between the spray chamber 8 and the evaporation opening 15 should be long enough. In one example, a gas channel 9 is arranged between the evaporation container 3 and the spray chamber 8. The organic gas evaporated from the evaporation opening 15 is charged uniformly by the electron "e" emitted from the electron emitter port, and then horizontally moves from the evaporation opening 15 into the spray chamber 8 through the gas channel 9.

In one example, an insulator 6 may be arranged between the electrode plate 7 and the spray chamber 8 for electrically isolating the electrode plate 7 from the spray chamber 8. The material of the insulator 6 is not limited herein. Under the effect of the vertically downward electric field force, the charged organic gas Q is accelerated and moved downwardly to the spray head 11 and then sprayed out.

FIG. 3 is a cross-sectional view schematically illustrating the depositing of the organic gas sprayed from the spray chamber 8 onto a surface of the substrate 13. A mask may be arranged between the spray head 11 and the substrate 13. After being accelerated, the charged organic gas passes through the mask 12 and is deposited on the substrate so as to form the organic film. Because the mask 12 is located over the substrate 13, the distance between the mask 12 and the platform 14 can be reduced, thus elastic fatigue and droop caused by thermal expansion and contraction of the large metallic mask can be avoided. Therefore, the deviation of alignment can be eliminated, and the accuracy of the deposition can be improved accordingly. The horizontal width of the spray chamber 8 is not limited herein, so as to form a large area organic film deposition.

Figure 4:
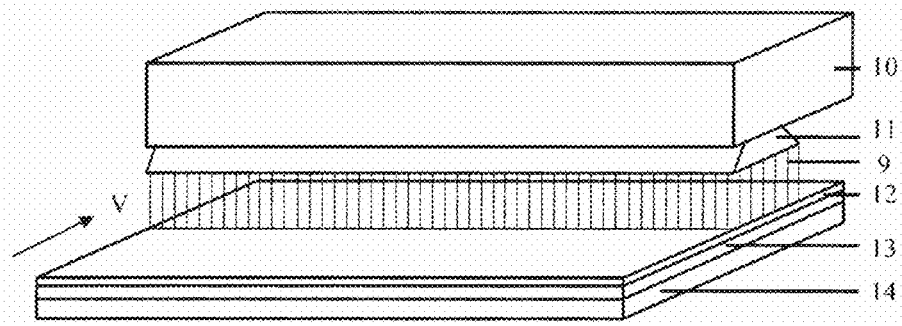
FIG. 4 is a three dimension (3D) view schematically illustrating an apparatus for coating an organic film and a movable substrate provided by the first embodiment of the present invention.

It is necessary to provide a relative motion with a constant velocity in a horizontal direction between the apparatus for coating an organic film and the substrate 13 of this embodiment. FIG. 4 schematically illustrates a working state of the apparatus for evaporating organic materials. For ensuring the organic material is uniformly coated on the entire substrate, the platform 14 moves at a given velocity "V" below the spray head 11. However, the manner of the relative motion between the apparatus and the substrate is not limited to move the platform with respect to the spray device, it is also feasible to move the spray device together with the spray chamber 8 at a given velocity with respect to the substrate. For achieving a desired thickness of the organic film, the spray chamber also may be moved in a reciprocating mode, which is facilitate to realize the mass production for large size substrate or device and improve the utilization of the organic material and the deposition rate.

In the first embodiment, the linear evaporation used in the apparatus for coating organic material can improve the utilization of the organic material. By accelerating the organic gas under the effect of the electric field, the deposition rate can be improved and the production time can be reduced, meanwhile, the moving direction of the organic gas is identical and the uniformity of the coated film can be realized. During the spray process, the organic gas moves from top to bottom of the spray chamber. By arranging the mask on the substrate, the deviation of alignment which is resulted from the elastic fatigue and the droop caused by the thermal expansion and contraction can be avoided and the accuracy of the deposition can be improved. Furthermore, by arranging the barrier over the evaporation opening, the evaporation opening can be closed when the evaporation is not necessary, thus the organic gas can not be escaped from the container, thereby saving the organic material and the cost.

Second Embodiment

Figure 5:
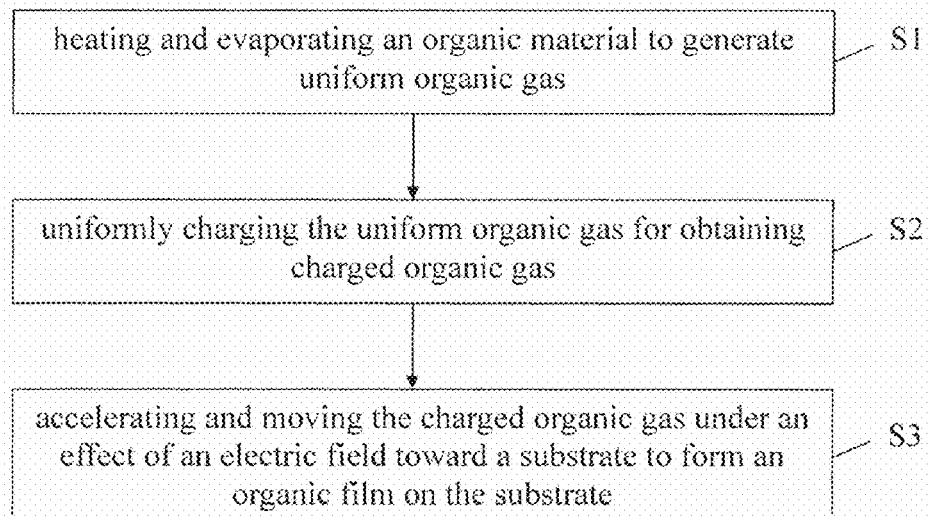
FIG. 5 is a flow chart illustrating a procedure of a method for coating an organic film provided by a second embodiment of the present invention.

As shown in FIG. 5, the second embodiment of the present invention provides a method for coating an organic film, which comprises:

Step S1: heating and evaporating an organic material to generate uniform organic gas. The step is performed in an evaporation container. The organic material, which is uniformly distributed on the bottom of the evaporation container, is gasified by the heat of a heating source arranged beneath the evaporation container wall.

In one example, the procedure of step S1 is shown in FIG. 6, which comprises:

Step S11: uniformly heating the organic material to generate the organic gas. The heating source, which uniformly heats the organic material, may be a linear heating source or a plurality of heating sources parallel to each other.

Step S12: linearly evaporating the organic gas and emitting the uniform organic gas. For example, the evaporation container is a linear evaporation container, at the top of which a slit-like evaporation opening is arranged, and the organic gas is uniformly exhausted through the evaporation opening.

Step S2: uniformly charging the uniform organic gas for obtaining charged organic gas. This step is carried out at the evaporation opening of the evaporation container.

For example, the electron (also may be a positive charge) is uniformly emitted by an electron emission device. Because the electron emission device arranged over the evaporation opening of the evaporation container, the electrons emitted from the electron emission device are attached to the uniform organic gas. Therefore, the charged organic gas can be obtained by uniformly charging the uniform organic gas. In the method of this embodiment, the organic material is charged after it becomes gas through evaporation. The advantage of this manner is that the organic gas is more easily to be charged uniformly, thus a more uniform organic film sprayed on the substrate can be obtained.

In one example, the charged organic gas moves from the evaporation opening to the spray chamber through a gas channel between the evaporation container and the spray chamber.

Step S3: accelerating and moving the charged organic gas under an effect of an electric field toward a substrate to form an organic film on the substrate.

In one example, the process of step S3 is shown in FIG. 7, which comprises:

S31: generating the electric field by a potential difference between an electrode plate arranged in top of the spray chamber and the base of the spray chamber, when a bias voltage being applied by the external power supply. In this embodiment, the electric field difference leaded by potential difference is provided by only one electrode plate rather than two electrode plates, which can save the material of the electrode plate and the cost.

S32: after the charged organic gas reaches the spray chamber, downwardly accelerating and moving the charged organic gas under an effect of a downward electric field force.

S33: after the charged organic gas reaches the spray head at bottom of the spray chamber, spraying the charged organic gas out of the spray head. Under the effect of the electric field force, the charged organic gas is moved from top to bottom of the spray chamber. As the organic gas is uniformly charged, it is sprayed out of the spray head uniformly under the effect of the uniform electric field force.

S34: depositing the sprayed organic gas which is passed through the mask to form the organic film on the substrate. Because the mask is located over the substrate 13, the distance between the mask and the platform 14 can be reduced, thus elastic fatigue and droop caused by thermal expansion and contraction of the large metallic mask can be avoided. Therefore, the deviation of alignment can be eliminated, and the accuracy of the deposition can be improved accordingly.

In the second embodiment, the linear evaporation used in the film coating method can improve the utilization of the organic material. By accelerating the organic gas under the effect of the electric field, the deposition rate can be improved and the production time can be reduced, meanwhile, the moving direction of the organic gas is identical and the uniformity of the coated film can be realized. During the spray process, the organic gas is sprayed from top to bottom of the chamber. By arranging the mask on the substrate, the deviation of alignment which is resulted from the elastic fatigue and the droop caused by the thermal expansion and contraction can be avoided and the accuracy of the deposition can be improved.

In summary, the embodiments of the present invention have modified traditional coating apparatus and provide a new apparatus and method for coating the organic film. By utilizing the linear evaporation, the organic gas is uniformly evaporated in the evaporation container. After evaporating, the organic gas is charged by the electrons emitted by the electron emission device and moved into the spray chamber. Under the effect of the electric field force generated by the electrode plate, the charged organic gas is moved downwardly to the spray head from which it is sprayed out. Finally, the sprayed spray organic gas passes through the mask and is deposited on the substrate to form the organic film. Compared with the evaporation method in conventional technology, the present invention has the following advantages:

(1) The organic gas is charged more uniformly, because the organic material is charged after it becomes organic gas through evaporation and the evaporated organic gas is charged by the electron emission device (such as the electron gun).

(2) The electric field is generated by only one electrode plate and the electrode plate is supplied with a positive or a negative bias voltage for generating the potential difference, thus the space of the spray chamber and the manufacture cost of the apparatus can be reduced.

(3) The evaporation container and the spray chamber are arranged separately, which ensures the uniformity of the organic gas evaporated from the evaporation container and the uniformity of the organic film formed by spraying process.

What are described above is related to the illustrative embodiments of the disclosure only and not limitative to the scope of the disclosure; the scopes of the disclosure are defined by the accompanying claims.

What is claimed is:

1. An apparatus for coating an organic film, wherein the apparatus comprises:
    an evaporation device, an electron emission device and a spray device;
    wherein said evaporation device comprises an evaporation container, said evaporation container is a linear evaporation container, in which a uniform organic gas is generated;
    said electron emission device is horizontally arranged over the evaporation container such that the organic gas evaporated in the evaporation container is uniformly charged and becomes charged organic gas;
    said spray device is provided with an electric field, under which the charged organic gas is moved toward a substrate so as to deposit the organic film on the substrate; and
    a movable barrier arranged neighboring to the evaporation opening for opening or closing said evaporation opening;
    wherein said evaporation container comprises a slit-like evaporation opening arranged at top of the evaporation container, said electron emission device comprises an electron emission port arranged over the evaporation opening;
    wherein the spray device comprises an electrode plate, a spray chamber and a spray head;
    wherein said electrode plate is arranged in top of the spray chamber, said spray head is arranged at bottom of the spray chamber; a bias voltage provided by an exterior power supply is applied to the electrode plate and an vertically downward electric field is generated, the charged organic gas is moved under effect of the electric field from an upper portion to an lower portion of the spray chamber and then sprayed out of the spray head;
    wherein a gas channel is arranged between said evaporation container and said spray chamber, said charged organic gas is horizontally moved from the evaporation chamber into the spray chamber through the gas channel.

2. The apparatus according to claim 1, wherein said evaporation device further comprises: a heating source, said heating source is a linear heating source or a plurality of heating sources parallel to each other and is arranged at bottom of the evaporation container to provide uniform heat for organic material evaporation.

3. The apparatus according to claim 2, wherein said evaporation container comprises a slit-like evaporation opening arranged at top of the evaporation container, said electron emission device comprises an electron emission port arranged over the evaporation opening.

4. The apparatus according to claim 1, wherein said evaporation container further comprises a cooling pipe arranged around the evaporation container for maintaining the evaporation container at a constant temperature.

5. The apparatus according to claim 1, wherein said electron emission device is a linear electron gun or a plurality of small-sized electron guns arranged with equal interval, which emits electrons uniformly.

6. The apparatus according to claim 1, wherein the magnitude of the bias voltage provided by the exterior power supply is adjusted depending on situation of the organic film deposition.

7. The apparatus according to claim 1, wherein an insulator is arranged between the electrode plate and the spray chamber.

8. The apparatus according to claim 1, wherein a mask is arranged between the spray head and the substrate.

9. The apparatus according to claim 1, wherein a relative motion with a constant velocity in a horizontal direction is generated between said apparatus and said substrate.

10. The apparatus according to claim 1, wherein said charged organic gas is sprayed out of the spray device from top to bottom.

* * * * *